(12) United States Patent
Kwak (10) Patent No.: US 8,895,984 B2
(45) Date of Patent: Nov. 25, 2014

(54) CAPACITOR

(75) Inventor: Won-Kyu Kwak, Suwon-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 389 days.

(21) Appl. No.: 11/205,611

(22) Filed: Aug. 17, 2005

(65) Prior Publication Data

US 2006/0043527 A1    Mar. 2, 2006

(30) Foreign Application Priority Data

Aug. 26, 2004  (KR) .................. 10-2004-0067451

(51) Int. Cl.
    *H01L 31/00* (2006.01)
    *H01L 27/12* (2006.01)

(52) U.S. Cl.
    CPC ...................................... *H01L 27/12* (2013.01)
    USPC ........ 257/59; 257/72; 257/E51.005; 438/149; 438/151; 349/38; 349/39

(58) Field of Classification Search
    USPC ............. 257/72, E51.005, 758, 59; 438/149, 438/151; 349/38, 39, 151
    See application file for complete search history.

(56) References Cited

U.S. PATENT DOCUMENTS

| | | | | |
|---|---|---|---|---|
| 5,182,620 A | * | 1/1993 | Shimada et al. | 257/72 |
| 5,270,968 A | * | 12/1993 | Kim et al. | 365/182 |
| 5,917,563 A | * | 6/1999 | Matsushima | 349/38 |
| 6,049,132 A | * | 4/2000 | Iwahashi et al. | 257/763 |
| 6,288,764 B1 | * | 9/2001 | Zhang et al. | 349/152 |
| 6,365,954 B1 | | 4/2002 | Dasgupta | |
| 6,384,427 B1 | * | 5/2002 | Yamazaki et al. | 257/59 |
| 6,538,708 B2 | * | 3/2003 | Zhang | 349/40 |
| 6,593,592 B1 | * | 7/2003 | Yamazaki et al. | 257/71 |
| 7,019,385 B1 | * | 3/2006 | Zhang et al. | 257/640 |
| 2004/0009863 A1 | | 1/2004 | Furuse et al. | |
| 2004/0257489 A1 | | 12/2004 | Gotoh et al. | |
| 2005/0104814 A1 | | 5/2005 | Choi et al. | |

FOREIGN PATENT DOCUMENTS

| | | |
|---|---|---|
| EP | 0698927 A2 | 2/1996 |
| JP | 58-028863 A | 2/1983 |
| JP | 04-241449 A | 8/1992 |
| JP | 06-235941 A | 8/1994 |
| JP | 09-269509 A | 10/1997 |
| JP | 2000-349259 A | 12/2000 |
| JP | 2001-527661 A | 12/2001 |
| JP | P2002-151649 A | 5/2002 |
| JP | 2003-037189 A | 2/2003 |
| JP | 2003-234410 A | 8/2003 |

(Continued)

*Primary Examiner* — Kenneth Parker
*Assistant Examiner* — John Lin
(74) *Attorney, Agent, or Firm* — Knobbe, Martens, Olson and Bear LLP (57) ABSTRACT

The present invention relates to a capacitor having a configuration in which capacitors are coupled in series to each other. The capacitor formed on a substrate according to an exemplary embodiment of the present invention includes: a polysilicon layer doped with an impurity; a first insulation layer formed on the polysilicon layer; a first metal layer formed on the first insulation layer and including first and second areas; a second insulation layer formed on the first metal layer; and a second metal layer formed on the second insulation layer and coupled to the second area of the first metal layer. The second metal layer is overlapped with at least a part of the first area of the first metal layer.

18 Claims, 10 Drawing Sheets

(56) References Cited

FOREIGN PATENT DOCUMENTS

| | | |
|---|---|---|
| JP | 2004151546 | 5/2004 |
| KR | 1020000013840 A | 3/2000 |
| KR | 10-2000-0074908 A | 12/2000 |
| KR | 1020030055504 A | 7/2003 |
| WO | 98/43298 A1 | 10/1998 |
| WO | 99/47971 A1 | 9/1999 |
| WO | WO 03/071511 A2 | 8/2003 |

* cited by examiner

CAPACITOR

CROSS-REFERENCE TO RELATED APPLICATION

This application claims the benefit of and priority to Korean Patent Application No. 10-2004-0067451, filed on Aug. 26, 2004 in the Korean Intellectual Property Office, the entire disclosure of which is incorporated herein by reference.

BACKGROUND

1. Field of the Invention

The present invention relates to a capacitor. More specifically, the present invention relates to a space-saving capacitor circuit for use in the pixel area of a light emitting display device.

2. Description of the Related Technology

Generally, a flat display panel (FDP), is a display device, in which light emitting elements are arranged between two substrates. The importance of the FDP has been emphasized following the development of multimedia technologies. In response to this trend, various flat displays such as the liquid crystal display (LCD) using a method for scattering light as the liquid crystals are roiled by an applied voltage, the field emission display using a phosphor light emission by electron beam, and the organic light emitting display device (hereinafter, referred to as an OLED device) using light emission of organic materials have been developed.

There are a passive matrix method and an active matrix method to provide control circuits of FDP devices. In the passive matrix method, electrodes are formed crossing each other, and a line is selected in order to drive the device. The active matrix method uses thin film transistors (TFT) for driving light emitting elements of FDP devices. In the active matrix method, the FDP device operates in response to a voltage maintained by capacitance of a capacitor coupled to a gate of the thin film transistor.

Figure 1:
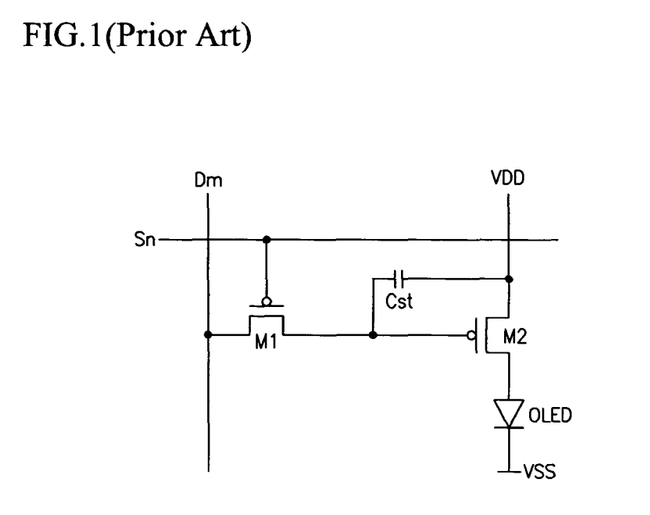
FIG. 1 shows a circuit representing a display element or pixel circuit of an OLED device.

FIG. 1 shows a circuit diagram of an OLED device, for example. As shown in FIG. 1, a pixel circuit of the OLED device include an organic light emitting diode OLED, two transistors M1 and M2, and a capacitor $C_{st}$. A power voltage VDD is coupled to a source of the driving transistor M2, and the capacitor $C_{st}$ is coupled between a gate and a source of the driving transistor M2. The capacitor $C_{st}$ maintains a gate-source voltage of VGS of the driving transistor M2 for a predetermined period. The switching transistor M1 transmits a data voltage from a data line Dm to the gate of the transistor M2 in response to a selection signal from a current scan line Sn. A cathode of the organic light emitting diode OLED is coupled to a reference voltage of Vss and emits a light corresponding to a current applied through the driving transistor M2.

As shown, in the active matrix method, each pixel circuit includes a thin film transistor and a capacitor, and the pixel circuit operates in response to a voltage maintained by capacitance of the capacitor $C_{st}$ that is coupled to the gate of the thin film transistor. A display quality of the pixel is better when comparing to the passive matrix method because an image corresponding to a data signal is continuously displayed in a frame, and therefore the active matrix method has become very popular these days.

Figure 2:
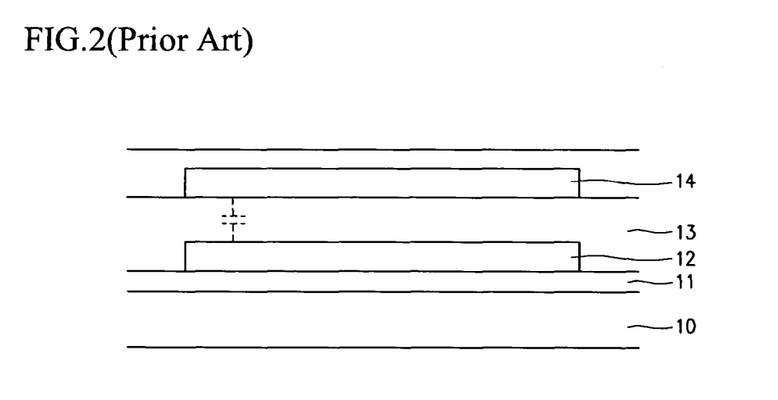
FIG. 2 shows a sectional view of a configuration of a capacitor formed on a substrate of a display panel.

FIG. 2 shows a sectional view of a configuration of a capacitor used in a display panel. A buffer layer 11 is formed on a substrate 10, and a conductive layer 12 forming an electrode of the capacitor is formed on the buffer layer 11. An insulation layer 13 is formed on the conductive layer 12, and a conductive layer 14 forming another electrode of the capacitor is formed on the insulation layer 13. Therefore the capacitor including the conductive layer 12 and the conductive layer 14 is formed. The capacitor is formed in an area forming a pixel circuit, and the horizontal widths of the capacitor are designed in view of the capacitance required according to characteristics of the display panel.

A thin film transistor is formed on a pixel area of the display panel in the active matrix method as well as the capacitor having a predetermined width, which may limit an area for forming display elements. Accordingly, an aperture ratio of the display panel may be decreased in an active matrix display device.

Further, OLED devices tend to use a pixel circuit having more than two capacitors and a plurality of thin film transistors in order to compensate a threshold voltage of a driving transistor. In such devices, the aperture ratio may be further decreased. In response to the trend, there is a high demand for a space-saving capacitor having proper capacitance in the pixel area.

The information disclosed in this Background of the Invention section is only for understanding of the background of the invention, and therefore, unless explicitly described to the contrary, it should not be taken as an admission of prior art.

SUMMARY OF CERTAIN INVENTIVE ASPECTS

One aspect of the present invention provides a capacitor having a configuration in which two capacitors are coupled in series to each other.

Another aspect of the present invention provides a capacitor formed on a substrate. The capacitor includes: a polysilicon layer doped with an impurity; a first insulation layer formed on the polysilicon layer; a first metal layer including first and second areas separately formed on the first insulation layer; a second insulation layer formed on the first metal layer; and a second metal layer formed on the second insulation layer and electrically connected to the second area of the first metal layer. The second metal layer is overlapped with at least a part of the first area of the first metal layer.

A further aspect of the present invention provides a capacitor formed on a substrate. The capacitor includes: a first conductive layer formed on the substrate in a single body; a first insulation layer formed on the first conductive layer; a second conductive layer including a first area and a second area separately formed on the first insulation layer; a second insulation layer formed on the second conductive layer; and a third conductive layer formed on the second insulation layer, overlapped with at least the first area of the second conductive layer, and electrically connected to the second area of the second conductive layer a same potential is applied to the first conductive layer and the third conductive layer in a first period, a first potential is applied to the third conductive layer and a potential which is different from the first potential is applied to the first conductive layer in a second period.

The first conductive layer is a polysilicon layer doped with impurity, and the second and third conductive layers are metal electrode layers.

The first conductive layer is electrically connected to the third conductive layer through a switch turned on in the first period, and the switch is a transistor having a source coupled to the third conductive layer and a drain coupled to the first conductive layer.

The first conductive layer is coupled to the third conductive layer through the switch turned on in the first period.

A further aspect of the present invention provides a capacitor device. The capacitor device includes: a first capacitor having a first electrode and a second electrode which insulated from and overlapped with the first electrode; a second capacitor having a third electrode formed in a single body with the first electrode and a fourth electrode insulated from and overlapped with the third electrode; a first switch for connecting the third electrode to a fifth electrode to which a first potential is applied in a first period, the fifth electrode is insulated from and overlapped with the second electrode, and connected to the fourth electrode; and a second switch for connecting the first electrode and a sixth electrode in a second period, the sixth electrode to which a second potential being different from the first potential is applied.

The first and third electrodes formed in a single body are consisted of a polysilicon layer doped with impurity.

The first switch is a transistor having a source coupled to the fifth electrode and a drain coupled to the third electrode.

The second switch is a transistor having a source coupled to the sixth electrode and a drain coupled to the first electrode.

The first capacitor is a capacitor formed by a third capacitor formed by the first electrode and the second electrode and a fourth capacitor formed by the second electrode and the fifth electrode, and the third and fourth capacitors are coupled in parallel in the first period.

The second capacitor is charged with a voltage corresponding to a difference between the first potential and the second potential in the second period.

In the following detailed description, only the embodiments of the invention have been shown and described, simply by way of illustration of the best modes contemplated by the inventor(s) of carrying out the invention. As will be realized, the invention is capable of modification in various obvious respects, all without departing from the invention. Accordingly, the drawings and description are to be regarded as illustrative in nature, and not restrictive.

DETAILED DESCRIPTION OF EMBODIMENTS

In the specification, like elements are denoted by like numerals. When an element is coupled to another element, the element may be directly coupled to the other element or coupled to the other element via a third element. When an element is formed on or over another element, the element may be formed right on the other element or formed on the other element including a third element therebetween.

Various embodiments of the invention are now discussed in the context of an organic light emitting display (OLED) device. However, the principle disclosed in the following embodiments can be applied in any flat display panel devices, including liquid crystal displays, field emission displays, plasma displays, etc.

Figure 5:
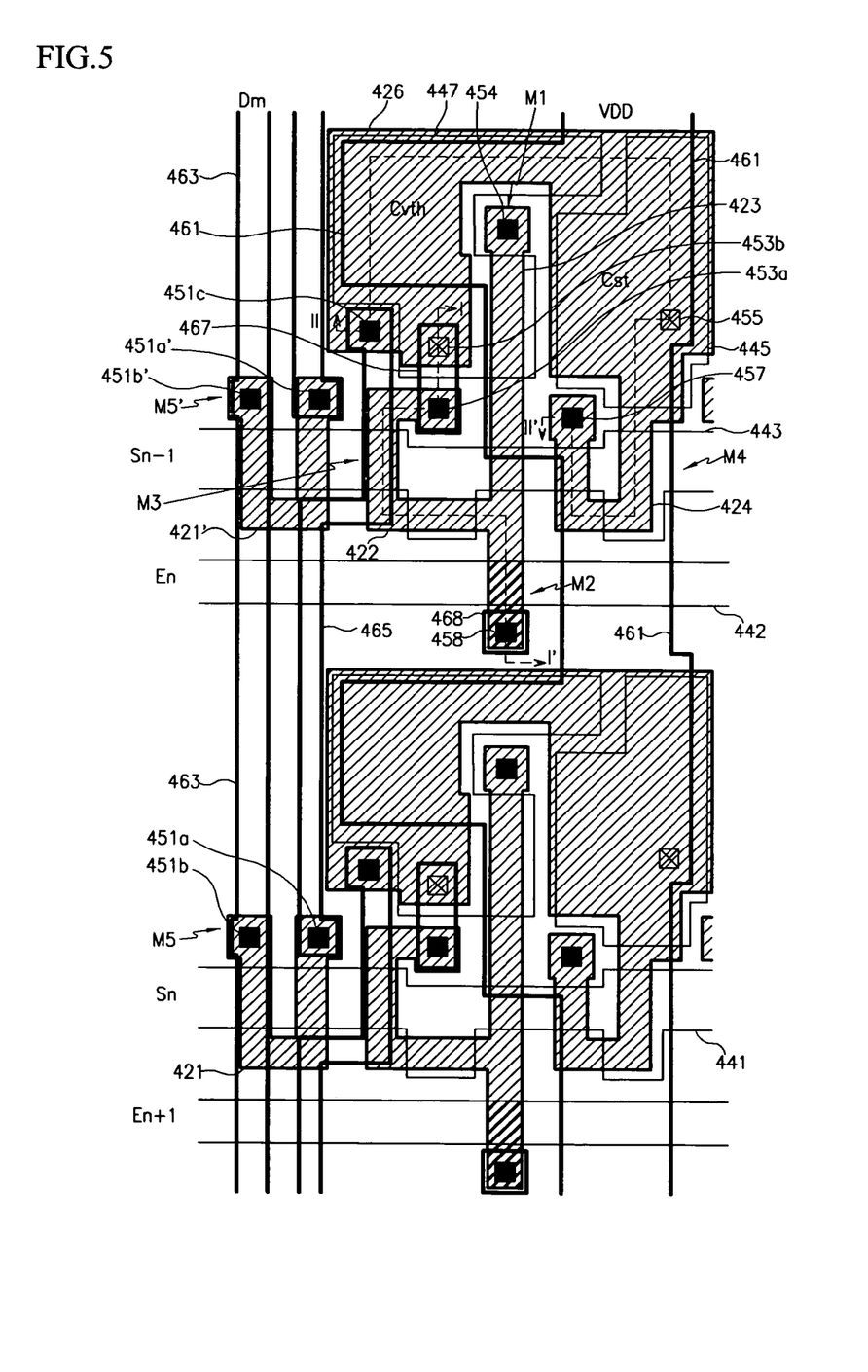
FIG. 5 shows a top plan view of an integrated circuit layout of the pixel circuit shown in FIG. 4.

As to the definitions, a scan line which is transmitting a current selection signal is referred to as a "current scan line," and a scan line which transmitted a selection signal immediately before the current selection signal is referred to as a "previous scan line." A scan line which is transmitting the current select signal is referred to as a "current scan line," and a scan line which transmitted the select signal before the current select signal is transmitted is referred to as a "previous scan line." Further, a scan line which transmits the selection signal immediately after the current selection signal is referred to as a "next scan line." Some components belonging to the immediately above pixel (Pn-1) are shown in FIG. 5 and (') is added to their reference numbers.

Figure 3:
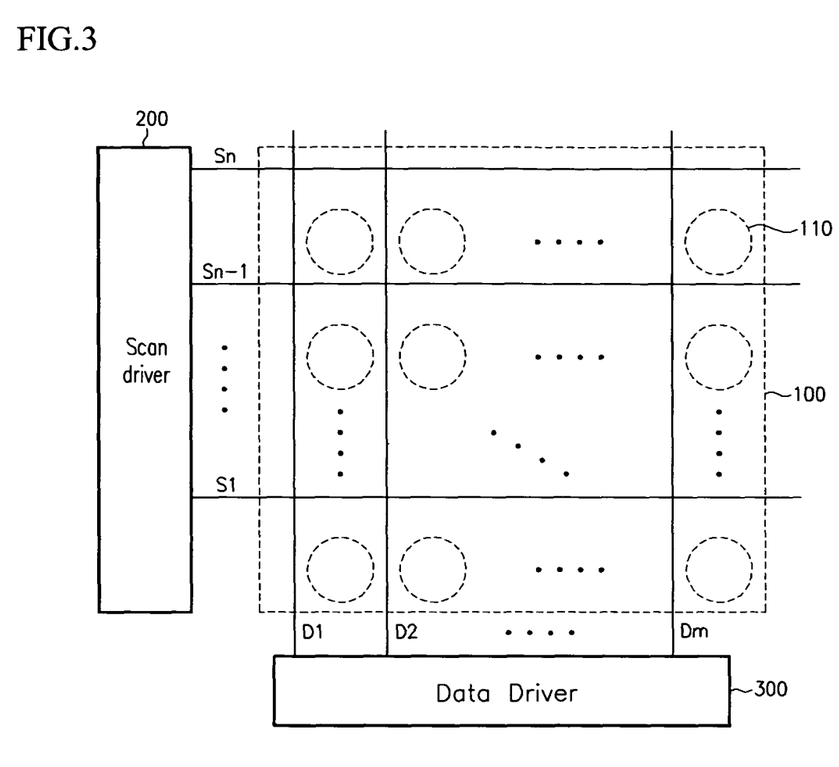
FIG. 3 shows a configuration of display elements and driving circuits of an OLED device according to an embodiment of the present invention.

As shown in FIG. 3, the OLED device includes an array of display elements 100, a scan driver 200, and a data driver 300. The display array 100 includes a plurality of data lines D1 to Dm extending in the column direction, a plurality of scan line S1 to Sn (while it is referred to as a gate line, hereinafter, it will be referred to as the scan line) extending in the row direction, and a plurality of pixel circuits 110. The data lines D1 to Dm transmit data signals representing an image signal to the pixel circuits 110. The scan lines S1 to Sn transmit selection signals to the pixel circuits 110. Each pixel circuit 110 is formed in a pixel area defined between two neighboring data lines and between two neighboring scan lines.

The scan driver 200 sequentially applies a selection signal to each of the respective scan lines S1 to Sn. The data driver 300 applies data voltages representing the image signal to the data lines D1 to Dm.

Figure 4:
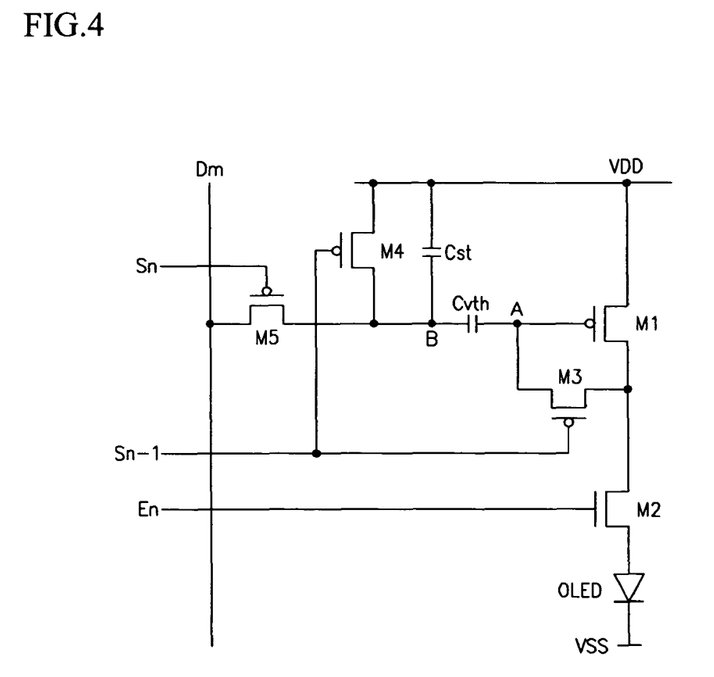
FIG. 4 shows a circuit representing a pixel circuit of an OLED device according to an embodiment of the present invention.

FIG. 4 shows an equivalent circuit representing a pixel circuit 110 of the OLED device according to an embodiment of the present invention. The illustrated embodiment is a pixel circuit coupled to an m-th data line Dm, a current scan line Sn, and a previous scan line Sn-1. The pixel circuit includes five transistors M1 to M5, two capacitors $C_{st}$ and $C_{vth}$, and an organic light emitting diode (OLED).

The transistor M1 for driving the organic light emitting diode OLED is coupled between a voltage source VDD and the organic light emitting diode OLED. The transistor M1 transmits a current to the organic light emitting diode OLED via the transistor M2 depending upon the voltage applied to a gate of the transistor M1. The gate of the transistor M1 is coupled to a node A of the capacitor $C_{vth}$. The capacitor $C_{st}$ and the transistor M4 are coupled in parallel between a node B of the capacitor $C_{vth}$ and the power voltage VDD.

The transistor M5 transmits a data voltage of the data line Dm to the node B of the capacitor $C_{vth}$ in response to the selection signal from the current scan line Sn. The transistor M4 couples between the node B of the capacitor $C_{vth}$ and the power voltage VDD in response to the selection signal from the previous scan line Sn-1. The transistor M3 allows the transistor M1 to be diode-connected in response to the selection signal from the previous scan line Sn-1. The transistor M2 is coupled between the drain of the transistor M1 and the anode of the OLED, and intercepts the drain of the transistor M1 to the OLED in response to the selection signal from a light emitting control line En. The OLED emits a light corresponding to a current input from the transistor M2.

An operation of the pixel circuit will now be described. A low level selection signal is applied to the previous scan line Sn-1, the transistor M3 is turned on, and the transistor M1 is diode-connected. Accordingly, a voltage between the gate and the source of the transistor M1 varies until the voltage reaches a threshold voltage $V_{th}$ of the transistor M1. The power voltage VDD is connected to the source of the transistor M1. Once the gate-source voltage of the transistor M1 reaches VDD+$V_{th}$, a voltage applied to the gate of the transistor M1 (the node A of the capacitor $C_{vth}$) is a sum of the power voltage VDD and the threshold voltage $V_{th}$. Also, the transistor M4 is turned on by the low level selection signal of scan line Sn-1, and the power voltage VDD is applied to the node B of the capacitor $C_{vth}$. The voltage of the capacitor $C_{vth}$ is given as Equation 1.

$$V_{Cvth} = V_{CvthA} - V_{CvthB} = (VDD + V_{th}) - VDD = V_{th} \qquad \text{Eq. 1}$$

In the foregoing equation, $V_{Cvth}$ denotes a voltage drop between the two electrodes of the capacitor $C_{vth}$. $V_{CvthA}$ denotes a voltage applied to the node A of the capacitor $C_{vth}$, and $V_{CvthB}$ denotes a voltage applied to the node B of the capacitor $C_{vth}$.

Meanwhile, the transistor M2 which is an n-channel transistor is turned off by a low level signal of the light emitting control line En, and prevents current through the transistor M1 from flowing to the OLED. The transistor M5 is turned off because a high level signal is applied to the current scan line Sn when the current scan line Sn-1 is applied a low level signal.

When the low level selection signal is applied to the current scan line Sn, the transistor M5 is turned on, and a data voltage $V_{data}$ is applied to the node B. The sum of the data voltage $V_{data}$ and the threshold voltage $V_{th}$ of the transistor M1 is applied to the gate of the transistor M1 because the threshold voltage $V_{th}$ of the transistor M1 was applied to the capacitor $C_{vth}$ during the previous scan (Sn-1) and the charge has not been cleared. The voltage $V_{gs}$ between the gate and the source of transistor M1 is given as Equation 2. At this time, the low level signal is applied to the light emitting control line En and the transistor M2 is turned off.

$$V_{gs} = (V_{data} + V_{th}) - VDD \qquad \text{Eq. 2}$$

The transistor M2 is turned on when the high level of the light emitting control line En is applied. Then, a current $I_{OLED}$ flows to the OLED, and the OLED emits a light. The current $I_{OLED}$ is given as Equation 3.

$$\begin{aligned} I_{OLED} &= \frac{\beta}{2}(V_{gs} - V_{th})^2 \\ &= \frac{\beta}{2}((V_{data} + V_{th} - VDD) - V_{th})^2 \\ &= \frac{\beta}{2}(VDD - V_{data})^2 \end{aligned} \qquad \text{Eq. 3}$$

Here, $I_{OLED}$ denotes current flowing through the OLED. $V_{gs}$ denotes a voltage between the source and the gate of the transistor M1. $V_{th}$ denotes a threshold voltage of the transistor M1. $V_{data}$ denotes a data voltage, and $\beta$ denotes a constant specific to the transistor M1.

As can be seen in Equation 3, in the illustrated pixel circuit, the current supplied to the organic light emitting diode OLED is independent of any deviation of the threshold voltage $V_{th}$ of the transistor M1.

Figure 6:
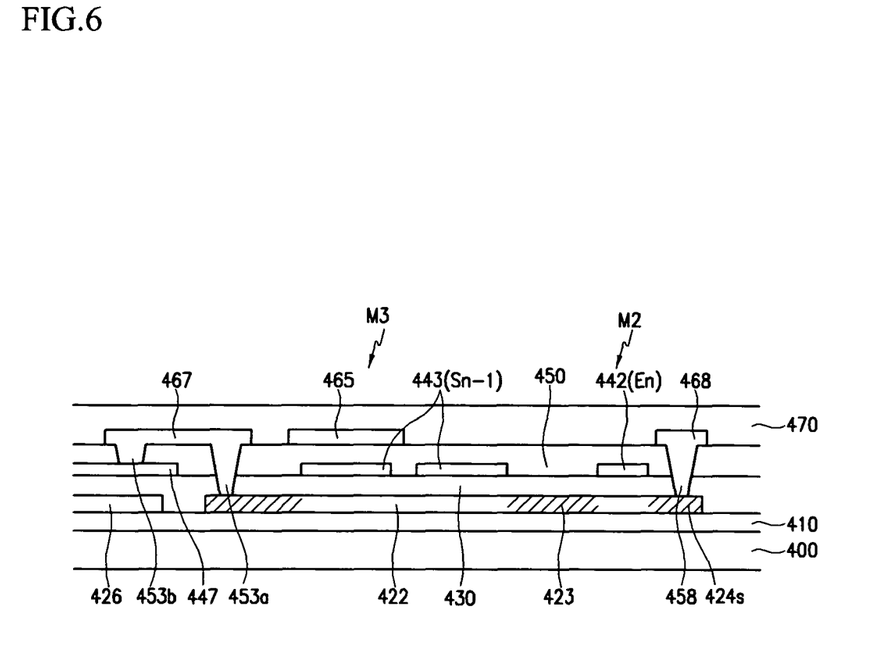
FIG. 6 shows a sectional view taken along the line I-I' shown in FIG. 5.

An arrangement of the pixel circuit according to the embodiment of the present invention will be described with reference to FIG. 5 and FIG. 6. FIG. 5 shows a top plan view representing an arrangement of the pixel circuit shown in FIG. 4, and FIG. 6 shows a sectional view taken along the dotted line I~I' shown in FIG. 5.

A polysilicon layer is used for a semiconductor layer, in FIG. 5. In FIG. 6, the areas doped with an n+ or p+ impurity are hatched. The blank (non-hatched) areas are intrinsic areas in the polysilicon layer. That is, channel areas of transistors respectively crossing gate electrode lines 442 and 443 are non-doped blank areas. On the other hand, drains and sources of the transistors are doped with the n+ or p+ impurities and therefore hatched.

Two pixel circuits are illustrated in FIG. 5, an upper pixel is a current pixel and a lower pixel is a next pixel. As shown in FIG. 5 and FIG. 6, a buffer layer 410 including a silicon dioxide is formed on an insulation substrate 400, and the polysilicon layers 421, 422, 423, 424, and 426 which are semiconductor layers are formed on the buffer layer 410.

In FIG. 5, the polysilicon layer 421 which is the semiconductor layer is formed in a lower part of the pixels in about "U" shape, and forms source, drain, and channel areas of the switching transistor M5 of the current pixel. The polysilicon layer 421' which is the semiconductor layer is formed in the like manner of the polysilicon layer 421, and forms source, drain, and channel areas of the switching transistor M5' of the previous pixel.

The polysilicon layer 422 is formed neighboring the polysilicon layer 421' in about "⊂" shape, and forms source, drain, and channel areas of the transistor M3 of the current pixel.

The polysilicon layer 423 is elongated in a middle of FIG. 5 in the column direction, and forms source, drain, and channel areas of the transistor M1 and source, drain, and channel areas of the transistor M2. The polysilicon layer 423 is arranged to be coupled to the polysilicon layer 422 as shown in FIG. 6, and the source area of the transistor M3 is electrically connected to the drain area of the transistor M1.

The polysilicon layer 424 is formed in a right side of the polysilicon layer 423 in about "U" shape, and forms source, drain, and channel areas of the transistor M4.

The polysilicon layer 426 is widely formed in the upper part of FIG. 5 in about "n" shape, and includes a first area forming an electrode of the capacitor $C_{vth}$ in a left side and a second area forming an electrode of capacitor $C_{st}$ in a right side. The first area and the second area are formed in a single body, and form a common electrode (node B shown in FIG. 4). The polysilicon layer 426 is electrically connected to the polysilicon layer 424, and coupled to the drain area of the transistor M4 and the electrodes of the capacitor $C_{st}$ and capacitor $C_{vth}$.

As shown in FIG. 6, a gate insulating layer 430 is formed on the polysilicon layer 421, 422, 423, 424, and 426 formed as above.

Referring back to FIG. 5, electrode lines for forming gates and electrodes (hereinafter referred to as a "gate layer") are formed on the gate insulating layer 430. The gate layer includes an electrode line 441 corresponding to a current scan line Sn, an electrode line 442 corresponding to the light emitting control line En, an electrode line 443 corresponding to the previous scan line Sn-1, an electrode 445 corresponding to another electrode of the capacitor $C_{st}$, and an electrode 447 corresponding to another electrode of the capacitor $C_{vth}$.

The electrode line 441 which is elongated in the row direction crosses the polysilicon layer 421, and forms a gate of the transistor M5 of the current pixel. The electrode line 442 which is elongated in the row direction crosses the polysilicon layer 423, and forms the gate of the transistor M2 of the current pixel. The electrode line 443 which is elongated in the row direction crosses the polysilicon layer 422 and the polysilicon layer 424, and respectively forms the transistor M3 and the transistor M4 of the current pixel. The electrode line 443 also crosses the polysilicon layer 421' and forms the transistor M5' of the previous pixel.

The electrode 445 is overlapped with the second area (right side) of the doped polysilicon layer 426 forming the electrode (node B shown in FIG. 4) of the capacitor $C_{st}$, and forms the other electrode of the capacitor $C_{st}$. The electrode 447 is overlapped with the first area (left side) of the doped polysilicon layer 426 forming the electrode (node B) of the capacitor $C_{vth}$, and forms the other electrode (node A) of the capacitor $C_{vth}$. The electrode 447 is elongated crossing the polysilicon layer 423, and forms the gate of the transistor M1 (node A) electrically connected to the other electrode of the capacitor $C_{vth}$.

As shown in FIG. 6, the gate electrodes 441, 442, 443, 445, and 446 are formed on an interlayer insulating layer 450. A power electrode line 461, a data line 463, connecting electrode lines 465, 467, and 468 are formed on the interlayer insulating layer 450.

Referring to FIG. 5, the power electrode line 461, the data line 463, and the connecting electrode lines 465, 467, and 468 are electrically connected to elements through contact holes 451a, 451b, 451c, 453a, 453b, 454, 455, 457, and 458. As shown in FIG. 5, the contact holes 451a, 451b, 451c, 453a, 454, 457, and 458 represented by "■" are contact holes touching the polysilicon layer through the interlayer insulating layer 450 and the gate insulating layer 430, and the contact holes 453b and 455 represented by "⊠" are contact holes touching the gate layer through the interlayer insulating layer 450.

The power electrode line 461 which is elongated in the column direction is widely formed in an area forming the capacitors $C_{st}$ and $C_{vth}$. The power electrode line 461 contacts the source area of the transistor M1 of the polysilicon layer 423 through the contact hole 454 and is electrically connected to the source of the transistor M1. The power electrode line 461 contacts the electrode 445 through the contact hole 455 and is electrically connected to the other electrode of capacitor $C_{st}$. The power electrode line 461 contacts the source area of the transistor M4 of the polysilicon layer 424 through the contact hole 457 and is electrically connected to the source of the transistor M4.

The data line 463 is elongated in the column direction, contacts the source area of the transistor M5 of the polysilicon layer 421 through the contact hole 451b, and is electrically connected to the source of the transistor M5. The data line 463 contacts the source area of the transistor M5' of the polysilicon layer 421' through the contact hole 451b', and is electrically connected to the source of the transistor M5'.

The connecting electrode line 465 contacts the drain area of the transistor M5 of the polysilicon layer 421 through the contact hole 451a, and also contacts a part of the polysilicon layer 426 through the contact hole 451c. That is, the connecting electrode line 465 electrically connects the drain of the transistor M5 to the electrode (node B) of the capacitor $C_{vth}$. The connecting electrode line 467 contacts the drain area of the transistor M3 of the polysilicon layer 422 through the contact hole 453a as shown in FIG. 6, and contacts the electrode 447 through the contact hole 453b. That is, the connecting electrode line 467 electrically connects the drain of the transistor M3 to the other electrode (node A) of the capacitor $C_{vth}$.

The connecting electrode 468 is formed neighboring the electrode line 442 as shown, contacts the drain area of the transistor M2 of the polysilicon layer 423 through the contact hole 458, and electrically connects the drain of the transistor M2 to an anode electrode (not shown) of the organic light emitting diode OLED formed on the connecting electrode 468.

A planarization layer 470 is formed on the above configured power electrode line 461, data line 463, and connecting electrode lines 465, 467, and 468. While the anode of the organic light emitting diode is not illustrated, the anode contacts the connecting electrode 468 through the contact hole penetrating the planarization layer 470, and is electrically connected to the drain of the transistor M2. A pixel define layer (PDL) is formed after the pixel electrode is formed, and a multi-layer structured organic layer including a light emitting layer (EML), an electron transport layer (ETL), and a hole transport layer (HTL) is formed on the pixel electrode of the light emitting area defined by the PDL.

As described, the capacitors $C_{vth}$ and $C_{st}$ are coupled to each other, and the polysilicon layer 426 is formed as the common electrode (node B) of the capacitors $C_{vth}$ and $C_{st}$. The layers 445 and 447 are respectively formed as the other electrode of the capacitors $C_{vth}$ and $C_{st}$ according to the arrangement of the illustrated embodiment.

Arrangement and connection of the two capacitors $C_{st}$ and $C_{vth}$ coupled to each other in series will be described with reference to FIG. 7 to FIG. 12.

Figure 7:
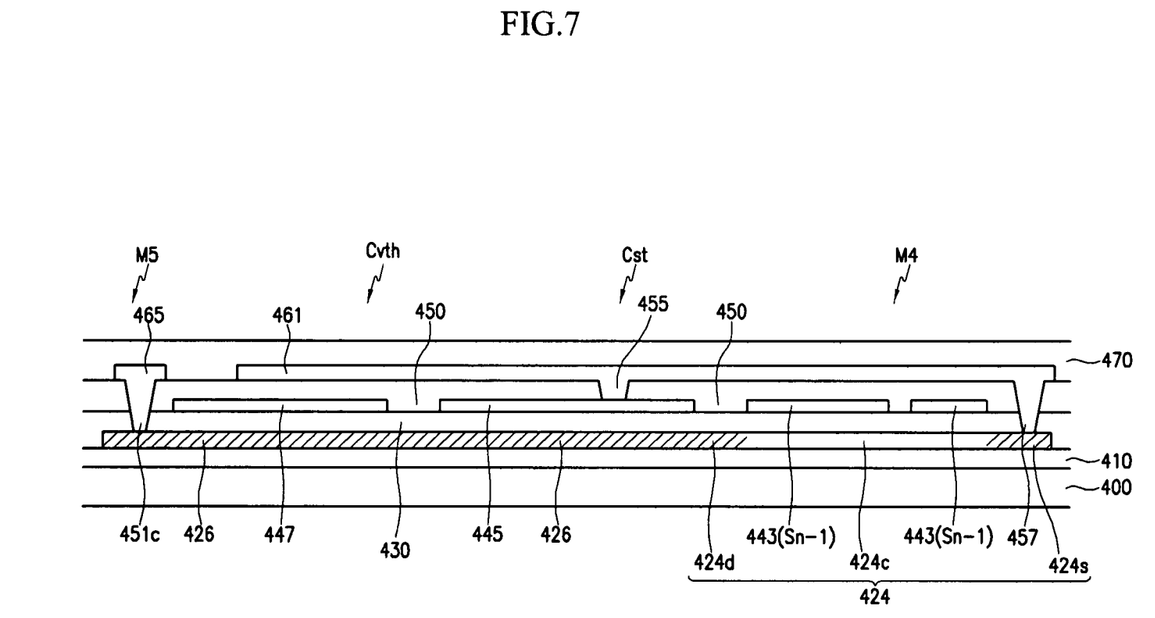
FIG. 7 shows a sectional view taken along the line II-II' shown in FIG. 5 for representing a sectional configuration of capacitors $C_{st}$ and $C_{vth}$.
Figure 8:
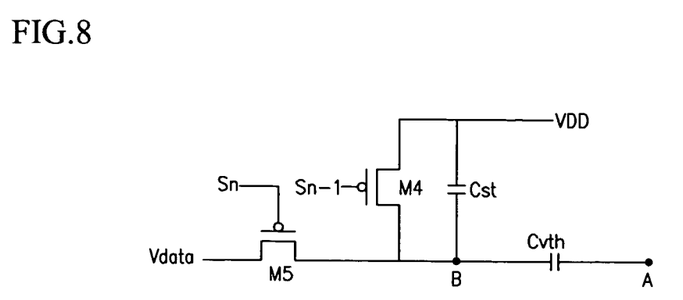
FIG. 8 shows a circuit representing the configuration shown in FIG. 7.

FIG. 7 shows a sectional view taken along the line II-II' shown in FIG. 5 for representing a sectional configuration of capacitors $C_{st}$ and $C_{vth}$, and FIG. 8 shows an equivalent circuit diagram representing the configuration shown in FIG. 7.

In FIG. 7, the buffer layer 410 is formed on a substrate 400, and the polysilicon layer 426 and the polysilicon layer 424 in a single body are formed on the buffer layer 410. The polysilicon layer 426 is substantially entirely doped with n+ or p+ impurities and forms the common electrode (node B) of the capacitors $C_{vth}$ and $C_{st}$. The polysilicon layer 424 forms source 424s, drain 424d, and channel 424c areas of the transistor M4. In FIG. 7, the hatched areas of the polysilicon layer 424 are doped with impurities and are the source 424s and drain 424d areas of the transistor M4, respectively. The area 424c of the polysilicon layer 424 located between the source 424s and drain 424d areas is not doped with impurities and forms the channel area 424c of the transistor M4. Accordingly, the common electrode (node B) of the capacitors $C_{st}$ and $C_{vth}$ is electrically connected to the drain of the transistor M4 because the polysilicon layer 426 (the common electrode) is directly coupled to the polysilicon layer 424d (drain of M4). The electrodes 445 and 447 are formed over a dielectric layer 428, which is formed on the polysilicon layer 426. The polysilicon layer 426, the electrode 445 and the intervening dielectric layer 428 form the capacitor $C_{st}$. The polysilicon layer 426, the electrode 447 and the intervening dielectric layer 428 form the capacitor $C_{vth}$. The connecting electrode 465 is electrically connected to the drain of the transistor M5 and contacts a terminal portion of the polysilicon layer 426 via the interconnect 451c. The data voltage $V_{data}$ applied to the drain of the transistor M5 is transmitted to the polysilicon layer 426 when the transistor M5 is turned on in response to the current selection signal Sn.

The layers 443 is connected to the previous scan line Sn-1 and is provided over the intervening dielectric layer 428 formed on the channel area 424c of the polysilicon layer 424, and forms the gate of the transistor M4. Dielectric layers 450 are deposited over the structures 428, 445, 447 and 450. A layer 461 is formed over the dielectric layers 450 and forms a power electrode line. The power electrode line 461 contacts the source area 424s of the transistor M4 via the interconnect 457. Accordingly, when the transistor M4 is turned on in response to the previous selection signal Sn-1, the power voltage VDD is applied to the polysilicon layer 426 through the transistor M4.

The transistor M5, transistor M4, capacitors $C_{vth}$ and $C_{st}$ as configured in FIG. 7 is equivalently represented by FIG. 8. When a low level is applied to the selection signal Sn-1 of the previous scan line, the transistor M4 is turned on and the power voltage VDD is applied to the node B. When the low level is applied to the selection signal Sn of the current scan line, the transistor M5 is turned on and the data voltage $V_{data}$ is applied to the node B.

Referring to FIG. 9 to FIG. 12, operations of the capacitors $C_{st}$ and $C_{vth}$ in a case that the previous selection signal Sn-1 is applied and in a case that the selection signal Sn is applied will be described.

Figure 9:
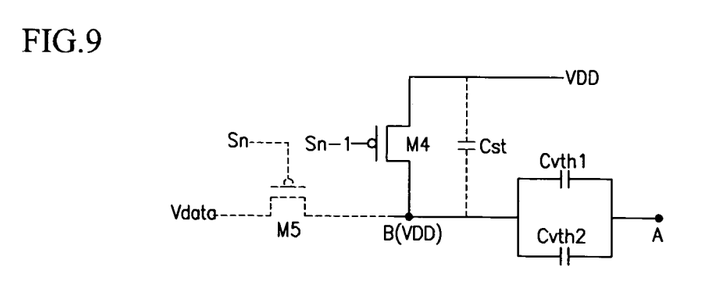
FIG. 9 shows a circuit representing the configuration shown in FIG. 7 when a previous selection signal Sn-1 is applied.
Figure 10:
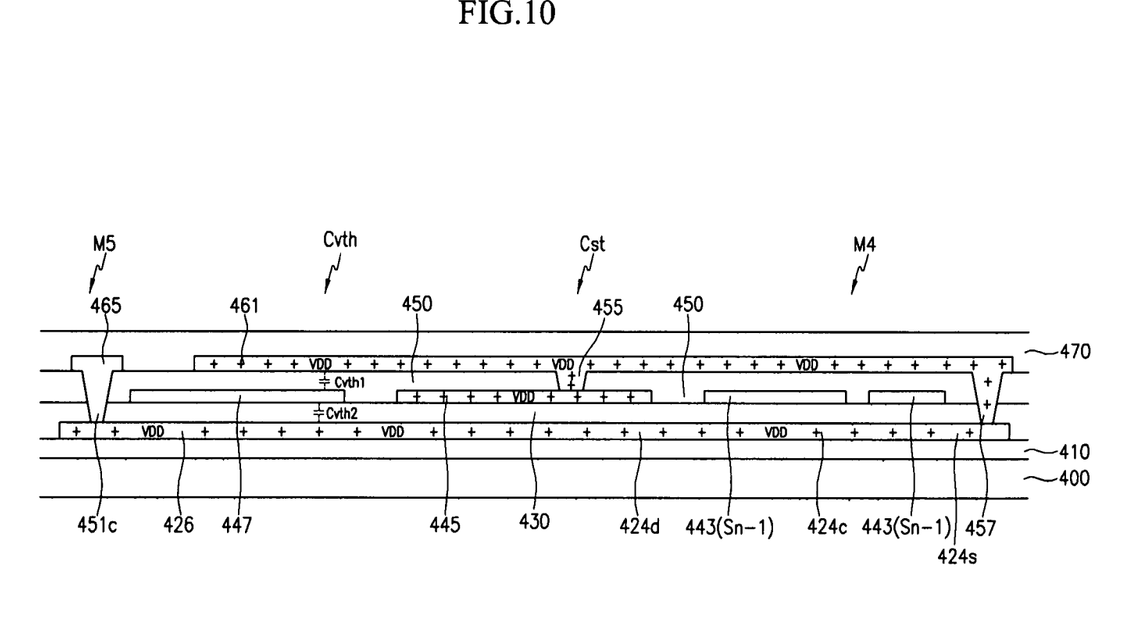
FIG. 10 shows a diagram representing potential of polysilicon layers 426 and 424 and electrodes 445 and 447 when the previous selection signal Sn-1 is applied.

FIG. 9 shows an equivalent circuit diagram representing the configuration shown in FIG. 7 when the previous selection signal Sn-1 is applied, and FIG. 10 shows a diagram representing potential of the polysilicon layers 426 and 424 and the electrodes 445 and 447 when the previous selection signal Sn-1 is applied.

A solid line shown in FIG. 9 shows that the transistor M4 is turned on and the power voltage VDD is applied to the node B when the selection signal Sn-1 is at the low level.

As shown in FIG. 10, a channel is formed in the channel area 424c of the polysilicon layer 424, and the power voltage VDD is applied to the source area 424s. The power voltage VDD is transmitted to the polysilicon layer 426 through the drain area 424d, and the potential of the polysilicon layers 424 and 426 is VDD. The power voltage VDD is applied to the electrode 445 via the interconnect 455. A first capacitor $C_{vth1}$ is formed between the electrode 447 (Note A) and the polysilicon layer 426 (node B) at the potential VDD, and a second capacitor $C_{vth2}$ is formed between the electrode 447 (node A) and the electrode line 461 at the same potential VDD, and therefore a multi-layer capacitor is formed. The first capacitor $C_{vth1}$ and second capacitor $C_{vth2}$ are parallelly connected as shown in FIG. 9. The potential of the polysilicon layer 426 is identical to that of the electrode 445, and therefore these layers do not operate as a capacitor as shown with dotted line in FIG. 9.

Figure 11:
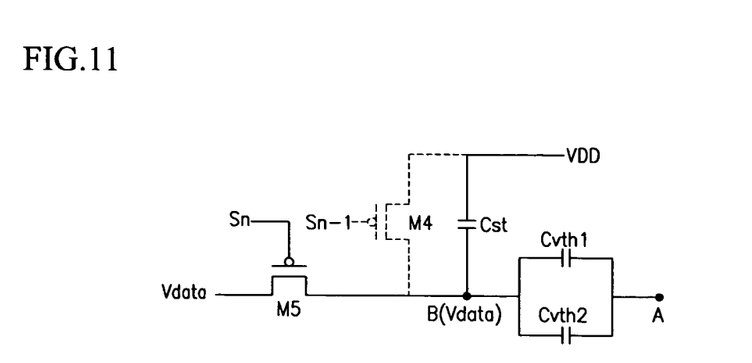
FIG. 11 shows a circuit representing the configuration shown in FIG. 7 when a current selection signal Sn is applied.
Figure 12:
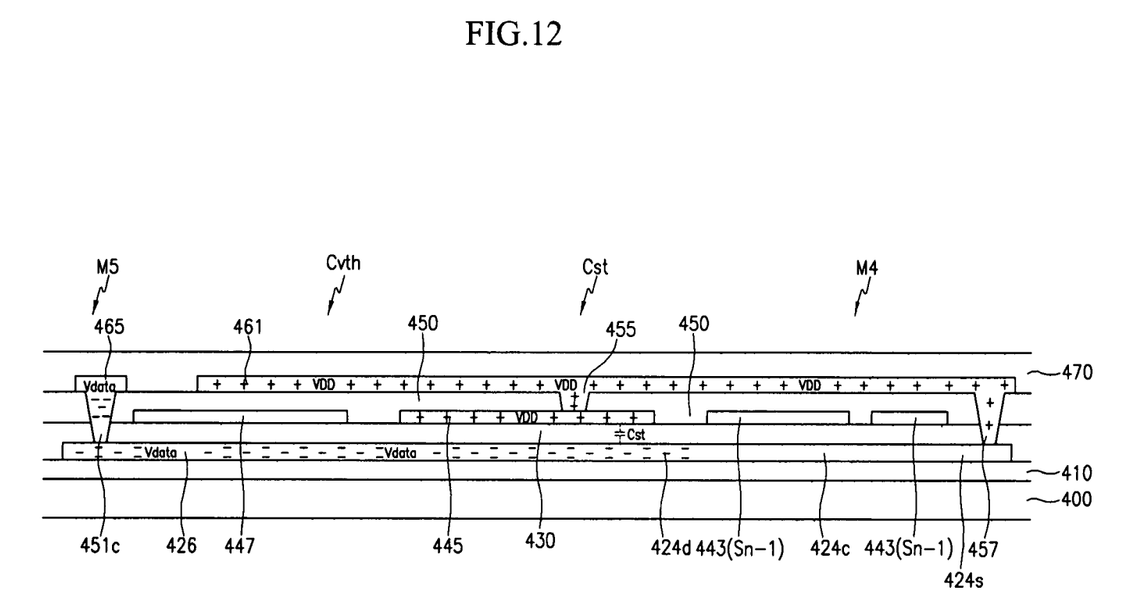
FIG. 12 shows a diagram representing potential of the polysilicon layers 426 and 424 and the electrodes 445 and 447 when the current selection signal Sn is applied.

The current selection signal Sn is applied after the previous selection signal Sn-1 is applied. FIG. 11 shows an equivalent circuit diagram representing the configuration shown in FIG. 7 when the current selection signal Sn is applied. FIG. 12 shows a diagram representing the potentials of the polysilicon layers 426 and 424 and the electrodes 445 and 447 when the current selection signal Sn is applied.

FIG. 11 shows that the transistor M4 (dotted lines) is turned off and the transistor M5 (solid lines) is turned on when the selection signal Sn is at the low level. At this time, the data voltage $V_{data}$ applied to the data line 463 (shown in FIG. 5) is applied to the node B.

In FIG. 12, the transistor M4 is turned off, and the power electrode line 461 is not equipotential with the polysilicon layer 426 which is one of the electrodes of the capacitor $C_{vth}$.

The transistor M5 is turned on in response to the selection signal Sn, and the data voltage $V_{data}$ is applied to the polysilicon layer 426 through the connecting electrode line 465. The potential of the electrode 445 is VDD because the electrode 445 is electrically connected to the power electrode line 461 via the interconnect 455. Accordingly, the polysilicon layer 426 and the electrode 445 form the capacitor $C_{st}$ with a potential difference between $V_{data}$ and VDD.

As described, the polysilicon layer 426 forms the common electrode (node B) of the capacitors $C_{st}$ and $C_{vth}$, and therefore it is not necessary to form additional contact hole and an interconnect or extension between the drain of the transistor M4 and the common electrode 126 of the capacitor $C_{st}$ and capacitor $C_{vth}$. The lacking of the contact holes makes the process of pixel formation simpler and less costly. Further, the aperture ratio can be improved because the light emitting area is increased by reducing the space needed for such interconnects and/or extensions.

In addition, sufficient capacitance is guaranteed because a planar area is narrowed by forming the capacitor $C_{vth}$ as a multi-layer capacitor and two connecting electrodes performs an electrode of a capacitor. The capacitor $C_{st}$ is coupled to the capacitor $C_{vth}$ through the polysilicon layer 426, and therefore it is not necessary to form an additional connecting electrode for coupling the two capacitors. Accordingly, an area in which the two capacitors are provided is reduced in the pixel area, and the aperture ratio is improved because an area including the connecting electrode is reduced in the pixel area.

Accordingly to the exemplary embodiments of the present invention, it is not necessary to form the additional contact hole and connecting electrode line in order to couple the drain of the transistor to the common electrode of the capacitors $C_{st}$ and $C_{vth}$ because the polysilicon layer forms the common electrode of the capacitors $C_{st}$ and $C_{vth}$ coupled in series. The reduction of the contact holes allows a process of pixel formation to be more convenient, and the aperture ratio is improved because the light emitting area is increased by the reduction of the connecting electrode lines.

In addition, sufficient capacitance is guaranteed because a planar area is narrowed by forming the capacitor $C_{vth}$ as a multi-layer capacitor and two connecting electrodes performs an electrode of a capacitor. The capacitor $C_{st}$ is coupled to the capacitor $C_{vth}$ through the polysilicon layer 426 in series, and therefore it is not necessary to form the additional connecting electrode for coupling the two capacitors in series. Accordingly, the area in which the two capacitors are provided is reduced in the pixel area, and the aperture ratio is improved because an area including the connecting electrode is reduced in the pixel area In the exemplary embodiments of the present invention, the OLED device has been exemplified, the present invention covers display devices and semiconductor devices in which two capacitors are coupled to each other in series.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A capacitor circuit for use in a display control circuit, the capacitor circuit comprising:
   a substrate;
   a polysilicon layer formed over the substrate, the polysilicon layer comprising a conductive portion doped with one or more impurities over a first area of the substrate and a transistor portion over a second area of the substrate, wherein the transistor portion forms a drain, a channel, and a source of a transistor, and wherein the transistor portion is electrically connected to the conductive portion;

a first insulation layer formed directly on the polysilicon layer;

a first metal layer formed directly on the first insulation layer, and the first metal layer comprising a first area and a second area formed on the first insulation layer, wherein the first area and the second area of the first metal layer are electrically separated from each other, wherein the first area of the first metal layer is electrically separated from the polysilicon layer, and wherein the second area of the first metal layer is electrically separated from the polysilicon layer when the transistor is turned off;

a second insulation layer formed on the first metal layer; and a second metal layer formed directly on the second insulation layer and directly connected to the second area of the first metal layer, wherein the first area of the first metal layer at least partially overlaps the conductive portion of the polysilicon layer when viewed in a direction perpendicular to a top surface of the conductive portion of the polysilicon layer, wherein the first area of the first metal layer at least partially overlaps the second metal layer when viewed in the direction.

2. The capacitor circuit of claim 1, wherein the second area of the first metal layer at least partially overlaps the polysilicon layer.

3. The capacitor circuit of claim 1, wherein the polysilicon layer, the first metal layer and the second metal layer are each connected to a power source such that there is a first capacitance between the polysilicon layer and the first area of the first metal layer, and there is a second capacitance between the first area of the first metal layer and the second metal layer when power is applied.

4. The capacitor circuit of claim 1, wherein the source of the transistor is electrically connected to the second metal layer.

5. A display device comprising an array of a plurality of display units, at least one of the display units comprising the capacitor circuit of claim 1.

6. The display device of claim 5, wherein the first conductive layer comprises a polysilicon layer doped with impurity.

7. The display device of claim 5, wherein at least one of the third and fourth conductive layers comprises a metal electrode layer.

8. The display device of claim 5, further comprising a switching circuit configured to selectively connect the first and second conductive layers to the same voltage.

9. The display device of claim 8, wherein the switching circuit comprises a transistor comprising a gate, a source and a drain.

10. The display device of claim 8, wherein the switching circuit is further configured to selectively electrically disconnect the first conductive layer from the second conductive layer.

11. The display device of claim 5, wherein the first and third conductive layers are configured to form a capacitance therebetween.

12. The display device of claim 5, wherein the third and second conductive layers are configured to form a capacitance therebetween.

13. The display device of claim 5, wherein the first and fourth conductive layers are configured to form a capacitance therebetween.

14. A capacitor circuit for use in a display control circuit, the capacitor circuit comprising:

a substrate;

a first conductive layer doped with one or more impurities formed in a single body over a first area of the substrate;

a transistor formed over a second area of the substrate, the transistor extending from the first conductive layer;

a drain, a channel, and a source of the transistor formed in the first conductive layer in the second area of the substrate, wherein the drain is electrically connected to the first conductive layer in the first area;

a first insulation layer formed directly on the first conductive layer;

a second conductive layer formed directly on the first insulation layer, and the second conductive layer comprising a first area and a second area formed on the first insulation layer, wherein the first area and the second area of the second conductive layer are electrically separated from each other, wherein the first area of the second conductive layer is electrically separated from the first conductive layer, and wherein the second area of the second conductive layer is electrically separated from the first conductive layer when the transistor is turned off;

a second insulation layer formed on the second conductive layer;

a third conductive layer formed directly on the second insulation layer, and directly connected to the second area of the second conductive layer, wherein the first area of the second conductive layer at least partially overlaps the first conductive layer when viewed in a direction perpendicular to surface of the first conductive layer, wherein the first area of the second conductive layer at least partially overlaps the third conductive layer when viewed in the direction; and wherein the first, second and third conductive layers are each connected to a power source such that there is a first capacitance between the first conductive layer and the first area of the second conductive layer, and there is a second capacitance between the first area of the second conductive layer and the third conductive layer.

15. The capacitor circuit of claim 14, wherein the transistor is configured to selectively connect the first conductive layer to the third conductive layer.

16. The capacitor circuit of claim 14, wherein the capacitor circuit is further configured to apply different voltages to the first and third conductive layers so as to form a third capacitance between the second area of the second conductive layer and the first conductive layer.

17. The capacitor circuit of claim 14, wherein the second area of the second conductive layer at least partially overlaps the first conductive layer when viewed in the direction.

18. The capacitor circuit of claim 14, wherein the third conductive layer is electrically connected to the source of the transistor.

* * * * *